US012575447B2

(12) United States Patent
Gao et al.

(10) Patent No.: US 12,575,447 B2
(45) Date of Patent: Mar. 10, 2026

(54) QFN PACKAGING STRUCTURE AND QFN PACKAGING METHOD

(71) Applicant: JCET GROUP CO., LTD., Wuxi City (CN)

(72) Inventors: Yun Gao, Wuxi City (CN); Ting Liu, Wuxi City (CN); Yuesheng Zhang, Wuxi City (CN); Rong Fan, Wuxi City (CN)

(73) Assignee: JCET GROUP CO., LTD., Wuxi City (CN)

( * ) Notice: Subject to any disclaimer, the term of this patent is extended or adjusted under 35 U.S.C. 154(b) by 778 days.

(21) Appl. No.: 17/887,380

(22) Filed: Aug. 12, 2022

(65) Prior Publication Data

US 2023/0050018 A1 Feb. 16, 2023

(30) Foreign Application Priority Data

Aug. 13, 2021 (CN) .......................... 202110929801.6

(51) Int. Cl.
*H01L 23/08* (2006.01)
*H01L 21/4757* (2006.01)
*H01L 23/053* (2006.01)
*H01L 23/552* (2006.01)

(52) U.S. Cl.
CPC ........ *H01L 23/08* (2013.01); *H01L 21/47573* (2013.01); *H01L 23/053* (2013.01); *H01L 23/552* (2013.01)

(58) Field of Classification Search
CPC . H01L 23/08; H01L 21/47573; H01L 23/053; H01L 23/552; H01L 23/49548; H01L 21/561; H01L 23/3107; H01L 23/3135
See application file for complete search history.

(56) References Cited

U.S. PATENT DOCUMENTS

2011/0278703 A1* 11/2011 Pagaila ................... H01L 24/19
257/659
2013/0105957 A1* 5/2013 Watanabe ............... H01L 24/97
257/E23.032
2015/0171021 A1* 6/2015 Takano ................. H01L 23/552
257/659

FOREIGN PATENT DOCUMENTS

CN 102244013 A 11/2011
CN 110444515 A 11/2019
CN 111640721 A * 9/2020

* cited by examiner

*Primary Examiner* — Dale E Page
*Assistant Examiner* — Daniel J Hibbert
(74) *Attorney, Agent, or Firm* — MUNCY, GEISSLER, OLDS & LOWE, P.C.

(57) ABSTRACT

The present invention provides a QFN packaging structure and QFN packaging method. By providing the insulating layer on the outer side of the leads of the QFN packaging structure, a short circuit between the leads and the electromagnetic shielding layer can be prevented. In addition, the grounding lead is exposed from the insulating layer, such that the electromagnetic shielding layer is grounded via the grounding lead, thereby realizing the electromagnetic shielding design of the QFN packaging structure.

6 Claims, 4 Drawing Sheets

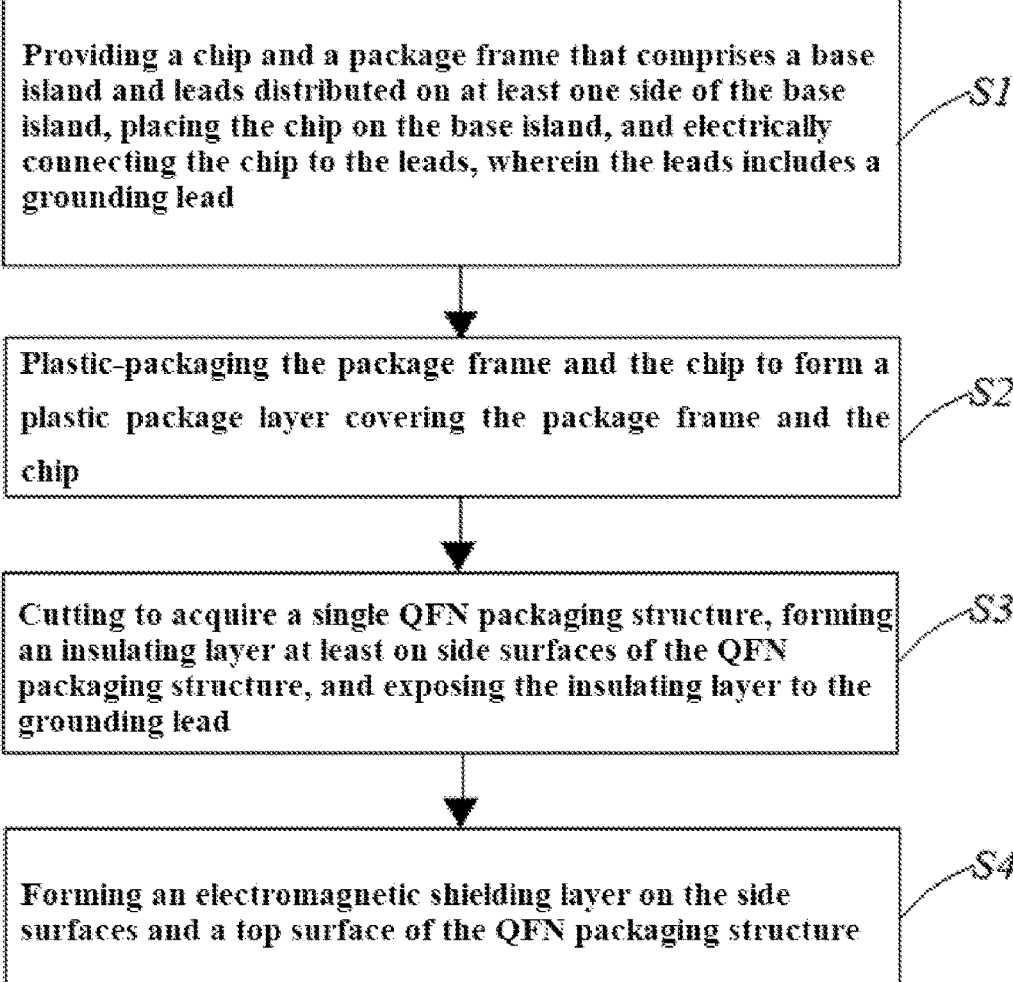

Providing a chip and a package frame that comprises a base island and leads distributed on at least one side of the base island, placing the chip on the base island, and electrically connecting the chip to the leads, wherein the leads includes a grounding lead

S1

Plastic-packaging the package frame and the chip to form a plastic package layer covering the package frame and the chip

S2

Cutting to acquire a single QFN packaging structure, forming an insulating layer at least on side surfaces of the QFN packaging structure, and exposing the insulating layer to the grounding lead

S3

Forming an electromagnetic shielding layer on the side surfaces and a top surface of the QFN packaging structure

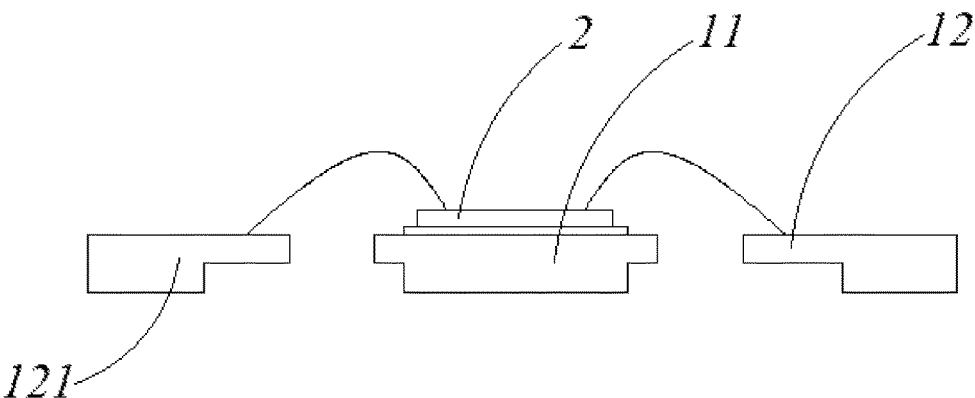

FIG. 4

QFN PACKAGING STRUCTURE AND QFN PACKAGING METHOD

TECHNICAL FIELD

The present invention relates to the field of packaging technologies, in particular to a QFN packaging structure and QFN packaging method.

BACKGROUND

With the development of electronic products in miniaturization and high density, a packaging product tends to be miniaturized, and is developed at higher density, higher integration, and higher power. As an electronic component becomes smaller and operates at higher frequencies, a high-frequency chip may generate strong electromagnetic waves during the operating process, which may thereby cause interference or noise to other chips in the package or electronic components outside the package. Furthermore, due to excessively high integration of the electronic components, signal transmission lines between the electronic components are getting closer and closer, such that the electro-magnetic interference (EMI) between chips outside or inside an integrated circuit package may be increasingly severe.

For conventional quad flat no-leads (QFN) packaging structures, leads are exposed to four side surfaces of a plastic package. However, an electromagnetic shielding layer generally directly covers over the plastic package, and is conductive. Thus, the direct contact between the conductive electromagnetic shielding layer and the leads may cause a short circuit between the leads, thereby affecting performances of the product.

SUMMARY

An object of the present invention is to provide a QFN packaging structure and QFN packaging method.

The present invention provides a QFN packaging structure. The QFN packaging structure comprises a package frame, a chip and a plastic package layer. The package frame comprises at least one base island, and leads distributed on at least one side of the base island; the chip is provided on the base island and electrically connected to the leads; and the plastic package layer covers the package frame and the chip, and side surfaces and a bottom surface of the lead are exposed to the plastic package layer. The QFN packaging structure further comprises an insulating layer and an electromagnetic shielding layer. The leads include a grounding lead; the electromagnetic shielding layer covers side surfaces and a top surface of the plastic package layer; the insulating layer is provided at least between the electromagnetic shielding layer and the leads and the grounding lead is exposed; and the electromagnetic shielding layer is grounded via the grounding lead.

As a further improvement of the present invention, the insulating layer covers the side surfaces and the top surface of the plastic package layer, and the electromagnetic shielding layer is provided on the insulating layer to cover side surfaces and a top surface of the QFN packaging structure.

As a further improvement of the present invention, the insulating layer is epoxy resin, polyimide, a dry film or solder resist ink.

As a further improvement of the present invention, the electromagnetic shielding layer is a metal film material made of copper, stainless steel, or titanium-sputtered sandwiched metal, or a conductive composite material such as a conductive resin having high-density metal filler of silver/copper, or a combination of at least two of the materials.

The present invention further provides a QFN packaging method, comprising:

providing a chip and a package frame that comprises a base island and leads distributed on at least one side of the base island, placing the chip on the base island, and electrically connecting the chip to the leads, wherein the lead comprises a grounding lead;

plastic-packaging the package frame and the chip to form a plastic package layer covering the package frame and the chip;

cutting to acquire a single QFN packaging structure, forming an insulating layer at least on side surfaces of the QFN packaging structure, and exposing the insulating layer to the grounding lead; and forming an electromagnetic shielding layer on the side surfaces and a top surface of the QFN packaging structure.

As a further improvement of the present invention, the method further comprises:

forming the insulating layer on the side surfaces and the top surface of the QFN packaging structure; and forming the electromagnetic shielding layer on side surfaces and a top surface of the insulating layer.

As a further improvement of the present invention, exposing the insulating layer to the grounding lead specifically comprises:

forming an opening by etching in a position of the insulating layer, which corresponds to the grounding lead.

As a further improvement of the present invention, exposing the insulating layer to the grounding lead specifically comprises:

forming an occlusion at a side edge of the grounding lead; and forming the insulating layer on the plastic package layer, and peeling off the occlusion.

As a further improvement of the present invention, the insulating layer is epoxy resin, polyimide, a dry film or solder resist ink.

As a further improvement of the present invention, the electromagnetic shielding layer is a metal film material made of copper, stainless steel, or titanium-sputtered sandwiched metal, or a conductive composite material such as a conductive resin having high-density metal filler of silver/copper, or a combination of at least two of the materials.

The present invention can achieve the following beneficial effects. By providing the insulating layer on the outer side of the leads of the QFN packaging structure according to the present invention, the short circuit between the leads and the electromagnetic shielding layer can be prevented. In addition, the grounding lead is exposed from the insulating layer, such that the electromagnetic shielding layer is grounded via the grounding lead, thereby realizing the electromagnetic shielding design of the QFN packaging structure.

BRIEF DESCRIPTION OF THE DRAWINGS

FIG. 3 is a schematic flowchart of a QFN packaging method according to an embodiment of the present invention; and FIG. 4 to FIG. 9 are schematic flowcharts of steps of the QFN packaging method according to an embodiment of the present invention.

DETAILED DESCRIPTION

Figure 1:
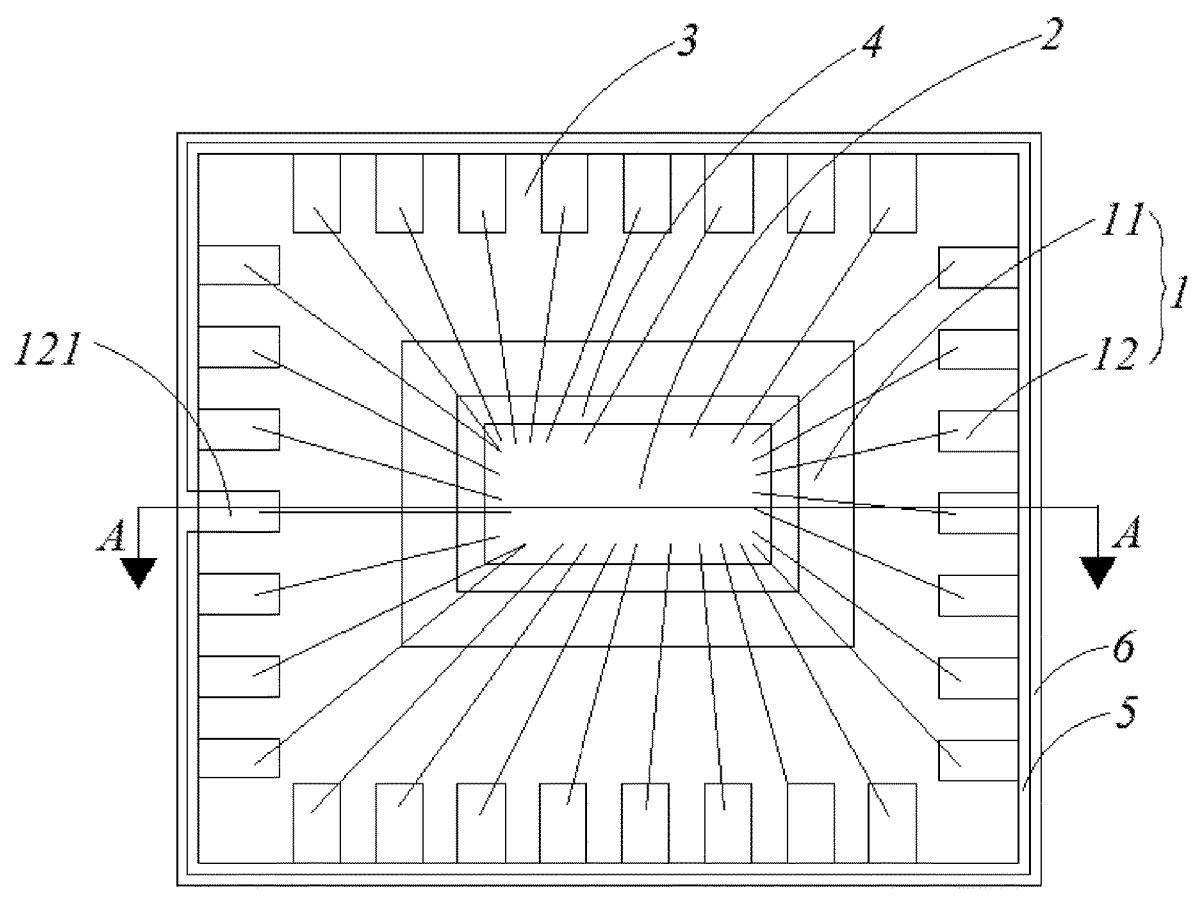
FIG. 1 is a schematic diagram of a QFN packaging structure according to an embodiment of the present invention.

In order to make the purpose, technical solutions, and advantages of the present application clearer, the technical solutions of the present application will be clearly and completely described below in conjunction with the specific embodiments of the present application and the corresponding drawings. Obviously, the described embodiments are only a part of the embodiments of the present application, rather than all of the embodiments. Based on the embodiments in present application, all other embodiments obtained by those of ordinary skill in the art without creative work shall fall within the protection scope of the present application.

The following describes the embodiments of the present invention in detail. Examples of the embodiments are shown in the accompanying drawings, in which the same or similar reference numerals indicate the same or similar elements or elements with the same or similar functions through the whole text. The following embodiments described with reference to the accompanying drawings are exemplary, and are only used to explain the present invention, but should not be understood as limiting the same.

For the convenience of description, this application uses terms representing the relative positions in space for description, such as "upper", "lower", "rear", "front", etc., which are used to describe the relationship of one unit or feature shown in the drawings relative to another unit or feature. The terms describing the relative positions in space may comprise different orientations of the equipment in use or operation other than the orientations shown in the drawings. For example, if a device in the drawings is turned over, the unit described as being "below" or "above" other units or features will be positioned "above" or "below" the other units or features. Therefore, the exemplary term "below" can encompass both spatial orientations of "below" and "above".

Figure 2:
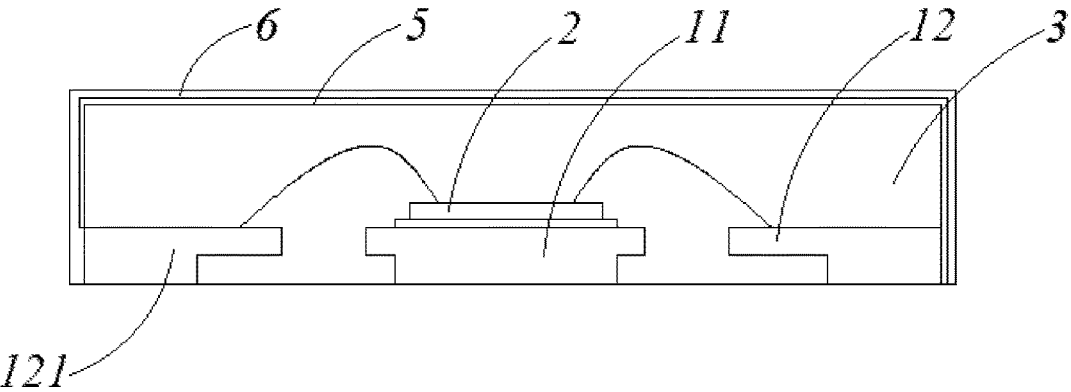
FIG. 2 is a cross-sectional view of FIG. 1 at A-A.

As shown in FIGS. 1 and 2, the present invention provides a QFN packaging structure, which comprises a package frame 1, a chip 2 and a plastic package layer 3. The package frame 1 comprises at least one base island 11, and leads 12 distributed on at least one side of the base island 11. The chip 2 is provided on the base island 11 and electrically connected to the leads 12. The plastic package layer 3 covers the package frame 1 and the chip 2, and side surfaces and a bottom surface of the lead 12 are exposed to the plastic package layer 3.

Exemplarily, in this embodiment, the package frame 1 comprises a base island 11 and leads 12 provided on the circumference of the four side edges. A back surface of the chip 2 is fixed on the base island 11 through a silver glue 4, and is electrically connected to the leads 12 by metal lead wires. In other embodiments, the package frame 1 may be provided with a plurality of base islands 11, and the leads 12 may he provided on two sides of the base islands 11, which is not specifically limited in the present invention.

The leads 12 include a grounding lead 121 for connecting a grounding wire in an internal circuit of the chip 2 to a grounding wire in an external circuit. The grounding wire may be defined as a low level or logic ground, and may provide a low impedance path for backflow of an electric current and an equipotential reference point or plane for the circuit or system. Other leads 12 further include a function lead, an I/O lead, a power lead, etc.

A tin layer may be coated on the outer side of the lead 12 and the back surface of the base island 11, and functions to protect the packaging structure from being affected an external environment.

The QFN packaging structure further comprises an insulating layer 5 and an electromagnetic shielding layer 6. The electromagnetic shielding layer 6 covers side surfaces and a top surface of the plastic package layer 3. The insulating layer 5 is provided at least between the electromagnetic shielding layer 6 and the power lead 12 and the grounding lead 121 is exposed from the insulating layer 5; and the shielding layer 6 is grounded via the grounding lead 121.

The electromagnetic shielding layer 6 may be a metal film material made of copper, stainless steel, or titanium-sputtered sandwiched metal, or a conductive composite material such as a conductive resin having high-density metal filler of silver/copper, or a combination of at least two of the materials, as long as the functions for reflecting and absorbing electromagnetic waves can be achieved. The electromagnetic shielding layer 6 is formed on sidewall surfaces and a top surface of the plastic package layer 3, thereby cooperating with the base island 11 to implement electromagnetic shielding protection to all surfaces of the chip 2.

The insulating layer 5 is an insulating material such as epoxy resin, polyimide, a dry film or solder resist ink, and is provided between the leads 12 and the electromagnetic shielding layer 6 for insulating them, such that the problem of short circuit can be prevented. The leads 12 in the QFN package are usually disposed at the bottom of the packaging structure, and the side surfaces and a bottom surface of the lead 12 as exposed to the plastic package layer 3 may form an electrical connection between the packaging structure and the external circuit. In addition, the electromagnetic shielding layer 6 covers all side surfaces of the packaging structure. Thus, the insulating layer 5 is at least formed on the side surfaces of the plastic package layer 3.

Specifically, in this embodiment, the insulating layer 5 is provided on the side surfaces and a top surface of the plastic package layer 3, and this structure may be formed in the manufacturing process directly on the surface of the plastic package layer 3 by a secondary plastic package process, which is easy and simple to implement.

Furthermore, the grounding lead 121 may be exposed from the insulating layer 5 to form an electrical connection between the electromagnetic shielding layer 6 and the grounding lead 121, such that the electromagnetic shielding layer 6 is grounded. The grounding may be designed as single-point grounding or multi-point grounding according to the needs of different circuits of the chip 2.

As shown in FIG. 3, the present invention further provides a QFN packaging method, which comprises the following steps S1 to S4.

In S1, as shown in FIG. 4, a chip 2 and a package frame 1 are provided. The package frame 1 comprises a base island 11 and leads 12 distributed on at least one side of the base island 11. Then, the chip 2 is placed on the base island 11, and is electrically connected to the leads 12.

Specifically, the chip 2 is pasted and fixed on the base island 11 through a silver glue 4, and is electrically connected to the leads 12 by metal lead wires.

Figure 5:
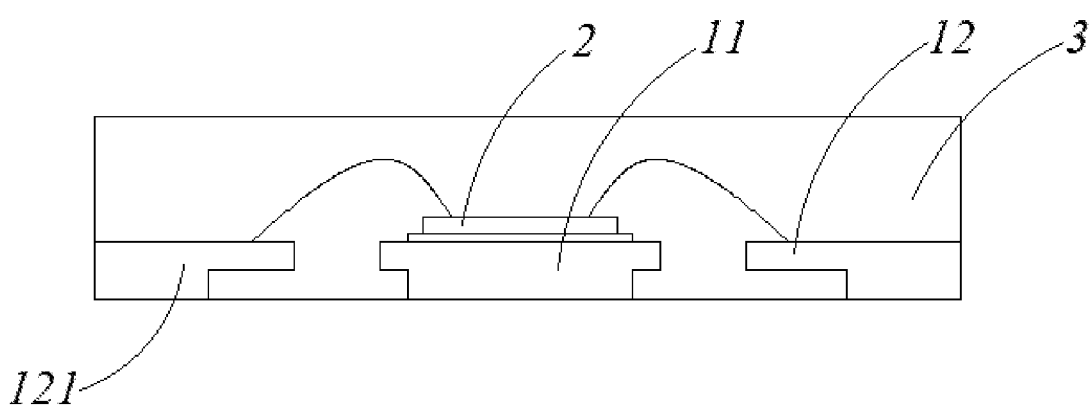

In S2, as shown in FIG. 5, the package frame 1 and the chip 2 are plastically packaged to form a plastic package layer 3 for covering the package frame 1 and the chip 2, and the plastic package layer 3 is exposed to the bottom surface of the lead 12.

Further, in some embodiments of the present invention, a tin layer may be coated on the leads 12 and a back surface of the base island 11.

Figure 6:
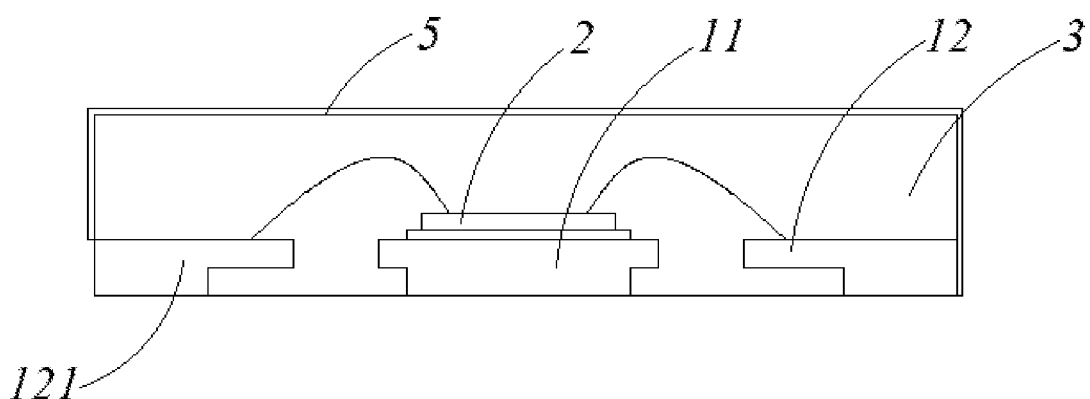

In S3, as shown in FIG. 6, a single QFN packaging structure is acquired by cutting, an insulating layer 5 is formed at least on side surfaces of the QFN packaging structure, and the insulating layer 5 is exposed to the grounding lead 121.

Specifically, the insulating layer 5 is epoxy resin, polyimide, a dry film, and the like. In this embodiment, the insulating layer 5 is formed by performing a secondary plastic package on the side surfaces and the top surface of the QFN packaging structure.

The insulating layer 5 at the grounding lead 121 is removed by etching at a position of the insulating layer corresponding to the grounding lead 121, and the grounding lead 121 is exposed to the insulating layer 5.

Figure 8:
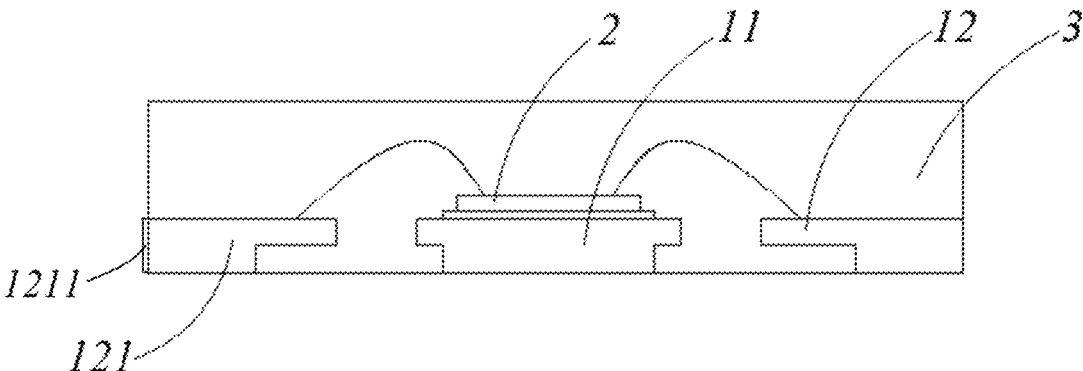
Figure 9:
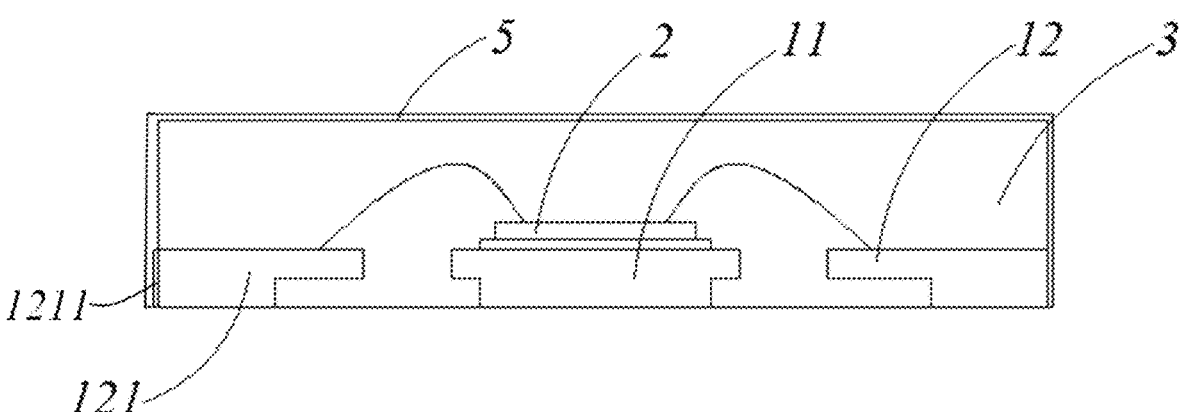

In other embodiments, the insulating layer 5 may also be formed by applying solder resist ink to the side surfaces and the top surface of the plastic package layer 3. In addition, as shown in FIG. 8 and FIG. 9, before forming the insulating layer, an occlusion 1211 is formed by a mould or additionally provided at the grounding lead 121. Then, the insulating layer 5 is formed, and the occlusion 1211 is peeled off to form a notch directly at the grounding lead 121, thereby further simplifying the process steps.

Figure 7:
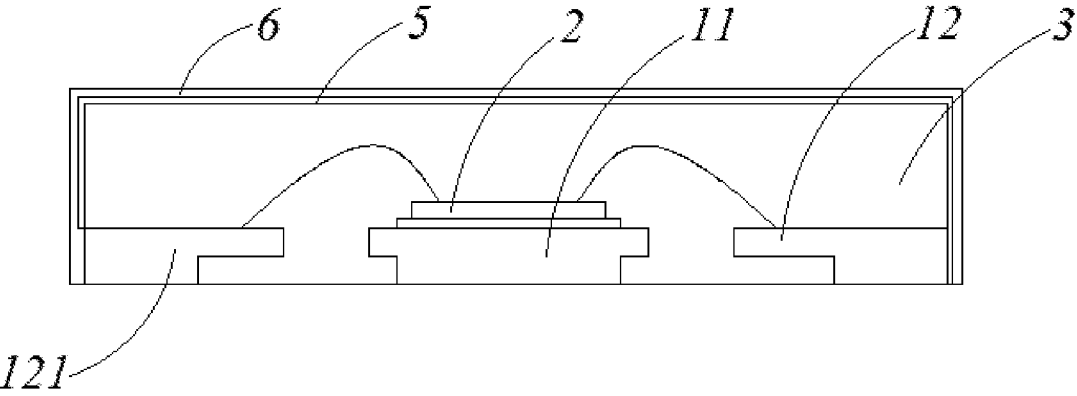

In S4, as shown in FIG. 7, an electromagnetic shielding layer 6 is formed on the side surfaces and the top surface of the QIN packaging structure.

The electromagnetic shielding layer 6 is a metal film material made of copper, stainless steel, or titanium-sputtered sandwiched metal, or a conductive composite material such as a conductive resin having high-density metal filler of silver/copper, or a combination of at least two of the materials.

Specifically, the electromagnetic shielding layer 6 is formed on side surfaces and a top surface of the insulating layer 5 by sputtering.

In summary, by providing the insulating layer 5 on the outer side of the leads 12 of the QFN packaging structure according to the present invention, the short circuit between the leads 12 and the electromagnetic shielding layer 6 can be prevented. In addition, the grounding lead 121 is exposed from the insulating layer 5, such that the electromagnetic shielding layer is grounded via the grounding lead, thereby realizing the electromagnetic shielding design of the QFN packaging structure.

It should be understood that although the present invention is described in terms of embodiments in this description, not every embodiment comprises only one independent technical solution. The statement mode of the description is merely for clarity, and those skilled in the art should regard the description as a whole. The technical solutions in various embodiments may also be combined properly to develop other embodiments that can be understood by those skilled in the art.

The series of detailed illustrations listed above are merely for specifically illustrating the feasible embodiments of the present invention, but not intended to limit the protection scope of the present invention. Any equivalent embodiments or variations made without departing from the technical spirit of the present invention shall fall within the protection scope of the present invention.

What is claimed is:

1. A QFN packaging structure, comprising: a package frame, a chip and a plastic package layer, wherein the package frame comprises at least one base island, and leads distributed on at least one side of the base island; the chip is provided on the base island and electrically connected to the leads; and the plastic package layer covers the package frame and the chip, and side surfaces and a bottom surface of the leads are exposed to the plastic package layer; wherein the QFN packaging structure further comprises an insulating layer and an electromagnetic shielding layer, wherein the leads include a grounding lead; the electromagnetic shielding layer covers side surfaces and a top surface of the plastic package layer; the insulating layer is provided at least between the electromagnetic shielding layer and the leads, and the grounding lead is exposed from the insulating layer; the insulating layer has a notch directly at the grounding lead; and the electromagnetic shielding layer is grounded via the grounding lead, wherein the insulating layer covers the side surfaces and the top surface of the plastic package layer, and the electromagnetic shielding layer is provided on the insulating layer to cover side surfaces and a top surface of the QFN packaging structure.

2. The QFN packaging structure according to claim 1, wherein the insulating layer is epoxy resin, polyimide, a dry film or solder resist ink.

3. The QFN packaging structure according to claim 1, wherein the electromagnetic shielding layer is a metal film material made of copper, stainless steel, or titanium-sputtered sandwiched metal, or a conductive composite material such as a conductive resin having high-density metal filler of silver/copper, or a combination of at least two of the materials.

4. A QFN packaging method, comprising:

providing a chip and a package frame that comprises a base island and leads distributed on at least one side of the base island, placing the chip on the base island, and electrically connecting the chip to the leads, wherein the leads include a grounding lead;

plastic-packaging the package frame and the chip to form a plastic package layer covering the package frame and the chip;

cutting to acquire a single QFN packaging structure;

forming an occlusion at a side edge of the grounding lead;

forming an insulating layer at least on side surfaces of the QFN packaging structure;

peeling off the occlusion to expose the grounding lead from the insulating layer;

forming an electromagnetic shielding layer on the side surfaces and the top surface of the QFN packaging structure;

forming the insulating layer on the side surfaces and the top surface of the QFN packaging structure, and forming the electromagnetic shielding layer on side surfaces and a top surface of the insulating layer; and forming an electrical connection between the electromagnetic shielding layer and the grounding lead.

5. The QFN packaging method according to claim 4, wherein the insulating layer is epoxy resin, polyimide, a dry film or solder resist ink.

6. The QFN packaging method according to claim 4, wherein the electromagnetic shielding layer is a metal film material made of copper, stainless steel, or titanium-sputtered sandwiched metal, or a conductive composite material such as a conductive resin having a high-density metal filler of silver/copper, or a combination of at least two of the materials.

* * * * *